(12) United States Patent
Wilfing

(10) Patent No.: US 11,784,115 B2
(45) Date of Patent: Oct. 10, 2023

(54) COMPONENT CARRIER HAVING DIELECTRIC LAYER WITH CONDUCTIVELY FILLED THROUGH HOLES TAPERING IN OPPOSITE DIRECTIONS

(71) Applicant: AT&S Austria Technologie & Systemtechnik Aktiengesellschaft, Leoben (AT)

(72) Inventor: Roland Wilfing, Santa Cruz, CA (US)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 17/444,266

(22) Filed: Aug. 2, 2021

(65) Prior Publication Data
US 2023/0035496 A1   Feb. 2, 2023

(51) Int. Cl.
*H05K 1/02* (2006.01)
*H05K 1/11* (2006.01)
*H01L 23/498* (2006.01)
*H01L 21/48* (2006.01)

(52) U.S. Cl.
CPC .... *H01L 23/49822* (2013.01); *H01L 21/4857* (2013.01); *H05K 1/0271* (2013.01); *H05K 1/11* (2013.01); *H05K 1/0204* (2013.01); *H05K 1/0206* (2013.01); *H05K 2201/041* (2013.01); *H05K 2201/06* (2013.01); *H05K 2201/096* (2013.01); *H05K 2201/09827* (2013.01)

(58) Field of Classification Search
CPC ........................ H01L 23/49822; H01L 21/4857
See application file for complete search history.

(56) References Cited

U.S. PATENT DOCUMENTS

| 2006/0083895 | A1* | 4/2006 | Ikeda | B32B 3/10 |
| | | | | 257/E23.079 |
| 2012/0111625 | A1* | 5/2012 | Jeong | H05K 3/427 |
| | | | | 29/852 |
| 2015/0114698 | A1* | 4/2015 | Huang | H05K 3/0094 |
| | | | | 174/257 |
| 2020/0015363 | A1* | 1/2020 | Kawashita | B23K 26/00 |
| 2020/0253062 | A1* | 8/2020 | Zhang | H05K 1/115 |
| 2021/0144849 | A1* | 5/2021 | Leitgeb | H05K 1/0346 |

FOREIGN PATENT DOCUMENTS

| JP | 2011100908 A | 5/2011 |
| KR | 20070062397 A | 6/2007 |

* cited by examiner

*Primary Examiner* — Ishwarbhai B Patel
(74) *Attorney, Agent, or Firm* — Robert A. Blaha; Smith Tempel Blaha LLC

(57) ABSTRACT

A component carrier includes a stack with at least one electrically conductive layer structure and at least one electrically insulating layer structure. At least one electrically insulating layer structure has at least partly tapering through holes filled substantially completely with an electrically conductive filling. The at least one electrically conductive layer structure and the electrically conductive filling are made of the same material. In addition, different ones of the through holes of one electrically insulating layer structure are tapering in opposite directions.

20 Claims, 4 Drawing Sheets

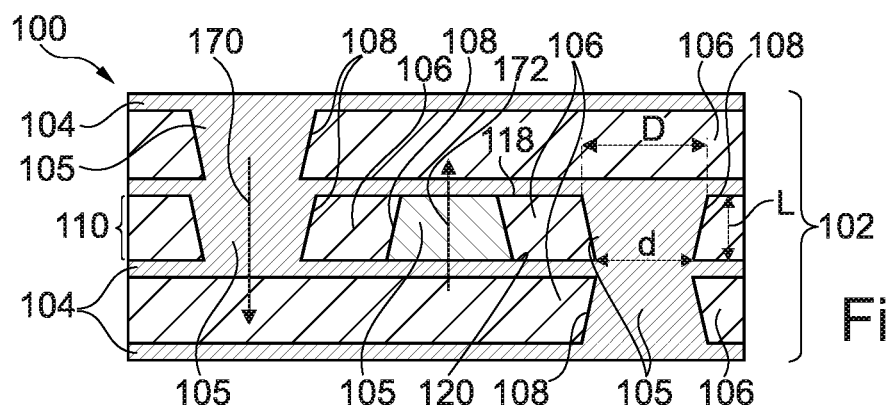
Fig. 1
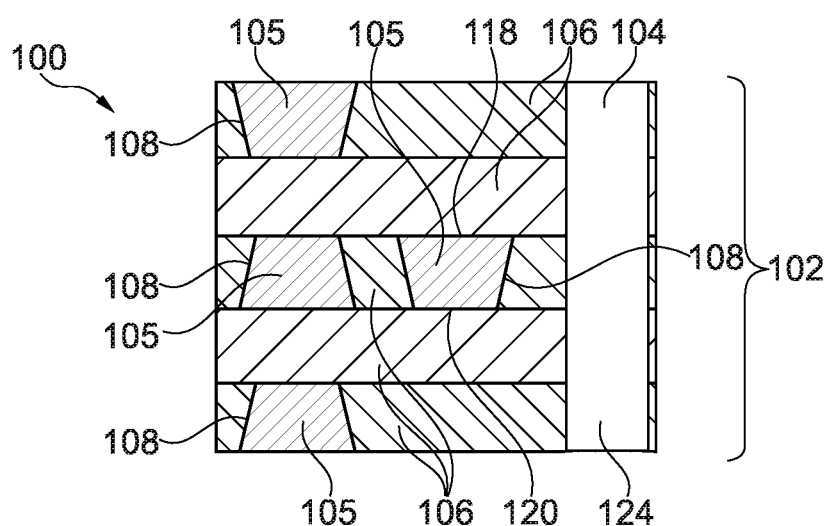
Fig. 2
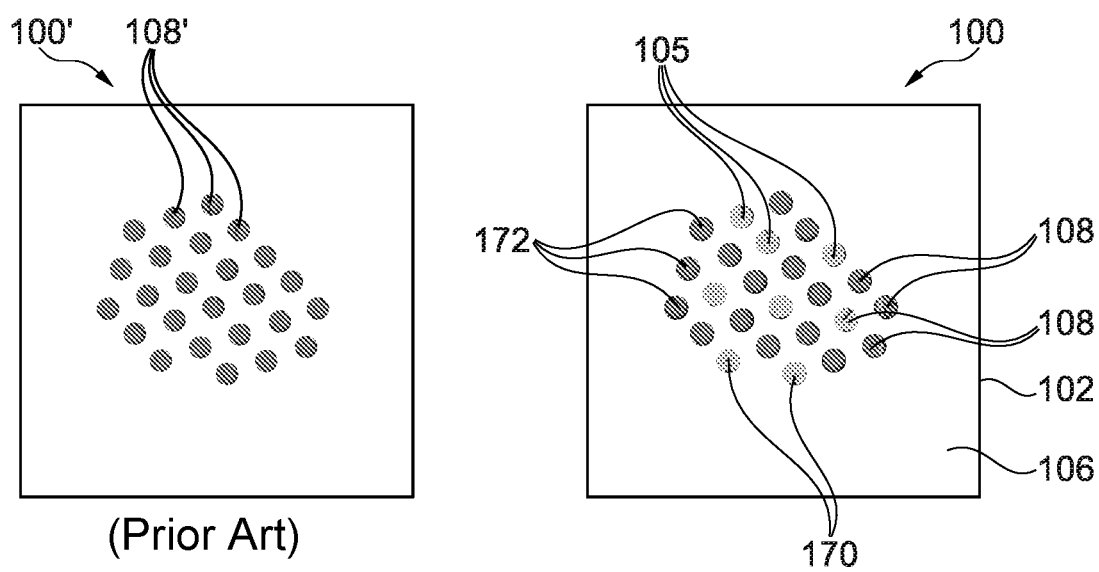
(Prior Art)
Fig. 3
Fig. 4

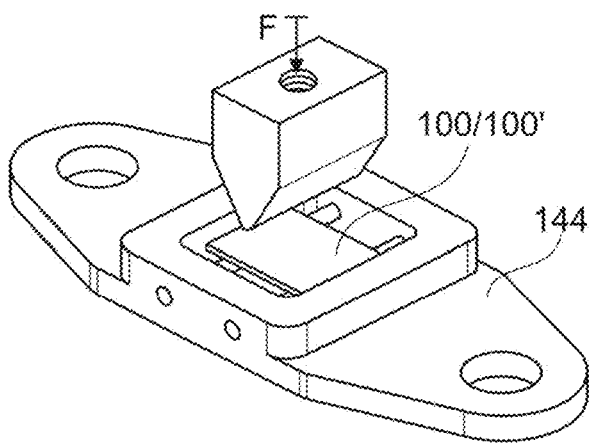
Fig. 8
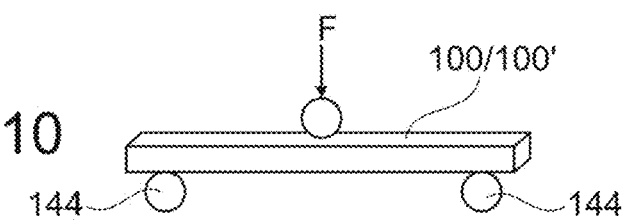
Fig. 9
Fig. 10
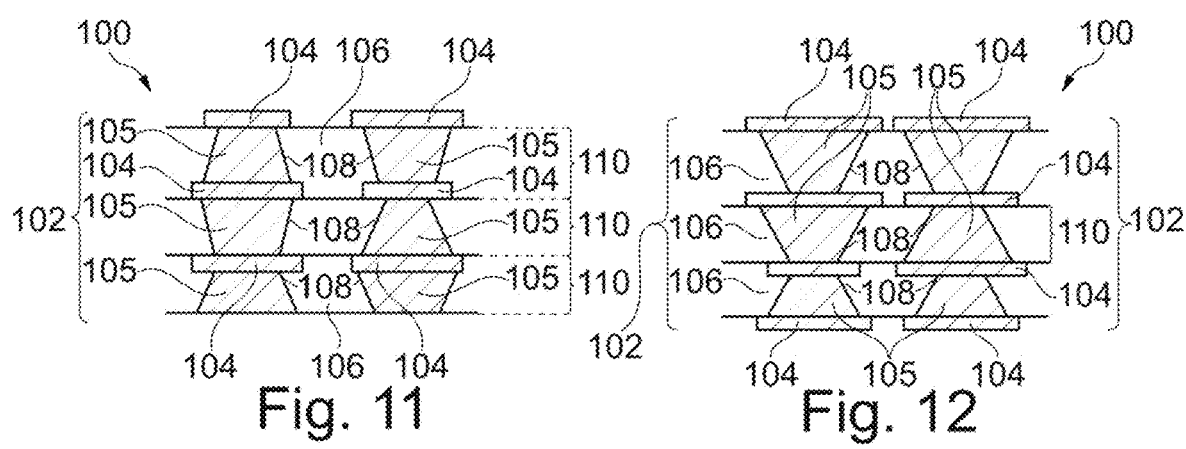
Fig. 11  Fig. 12

COMPONENT CARRIER HAVING DIELECTRIC LAYER WITH CONDUCTIVELY FILLED THROUGH HOLES TAPERING IN OPPOSITE DIRECTIONS

TECHNICAL FIELD

Embodiments of the invention generally relate to a component carrier, and to a method of manufacturing a component carrier.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts, the removal of heat generated by such components and the component carrier itself during operation becomes an increasing issue. At the same time, component carriers shall be mechanically robust and electrically reliable so as to be operable even under harsh conditions.

Efficiently forming vertical through connections such as metal-filled vias in a component carrier is still an issue, in particular for high density integration (HDI) applications with a large number of vias per area or volume. Conventional component carriers with a large number of metal-filled vias may suffer frequently from issues such as low-stiffness regions and related accuracy issues, delamination and/or warpage.

SUMMARY

There may be a need for component carriers with being manufacturable with high mechanical integrity and accuracy.

According to an exemplary embodiment of the invention, a component carrier is provided which comprises a stack comprising at least one electrically conductive layer structure and at least one electrically insulating layer structure, wherein at least one of the at least one electrically insulating layer structure has at least partly tapering through holes filled substantially completely with an electrically conductive filling, wherein the at least one electrically conductive layer structure and the electrically conductive filling are made of the same material, and wherein different ones of the through holes of one electrically insulating layer structure are tapering in opposite directions.

According to another exemplary embodiment of the invention, a method of manufacturing a component carrier is provided, wherein the method comprises providing a stack comprising at least one electrically conductive layer structure and at least one electrically insulating layer structure, forming at least partly tapering through holes in at least one of the at least one electrically insulating layer structure, wherein different ones of the through holes of one electrically insulating layer structure are tapering in opposite directions, and substantially completely filling the through holes with an electrically conductive filling made of the same material as the at least one electrically conductive layer structure.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "through hole" may particularly denote a hole extending completely through an entire electrically insulating layer structure, and which may be formed in particular and preferably by laser processing. Thus, the through hole may be a laser through hole. Formation of a through hole by laser processing from only one main surface of an electrically insulating layer structure may be preferred. However, formation of a through hole may be carried out as well by other methods than laser processing, for instance by a plasma treatment, by wet etching, etc.

In the context of the present application, the term "at least partly tapering through hole" may particularly denote a through hole becoming thinner or narrower towards one end at least along a section thereof. However, an at least partly tapering through hole may also have a non-tapering section, for instance such a through hole may have a straight section in a cross-sectional view. More generally, an at least partly tapering through hole may have a larger cross-sectional area at one end as compared to an opposing other end. Tapering of a through hole may be continuous, for instance in accordance with a cross-section of a through hole with a sidewall being continuously straight or continuously curved (for instance in a concave or convex manner). However, tapering of a through hole may also be discontinuous, for instance in accordance with a cross-section of a through hole with a sidewall having one or more kinks and/or steps. Tapering through holes may be created by a laser drilling process, since a laser beam impacting the layer stack from one side thereof may create, when appropriate processing parameters are adjusted, a through hole having a larger diameter at a side facing a laser source as compared to another side opposing a laser source. For clarification it should be said that a through hole does not necessarily have to extend through an entire layer stack, but for instance through a single electrically insulating layer structure or a subset of electrically insulating layer structures of a stack. In embodiments, interconnections can connect one or more layers with each other. In particular, laser vias connecting two or more layers are also an option.

In the context of the present application, the term "through holes tapering in opposite directions" may particularly denote antiparallel directions of different through holes along which the through holes taper. However, the opposite directions may also assume a mutual slanting angle. More generally, a tapering direction may correspond to a vector pointing from a wider end towards a narrower end of the through hole in the electrically insulating layer structure. Vectors of through holes tapering in opposite directions may be antiparallel, wherein a certain deviation of for instance not more than ±30° (in particular not more than ±10°) may be possible. In particular, one of the through holes tapering in opposite directions may become thinner or narrower in a downward direction, whereas another one said through holes may become thinner or narrower in an upward direction.

In the context of the present application, the term "through hole filled substantially completely with electrically conductive filling" may particularly describe the fact that basically the entire volume of the through hole may be filled with an electrically conductive material. However, a person skilled in the art will understand that, due to imperfections of a manufacturing process, one or more microscopic voids may remain inside of a metal filled through hole. It may also happen that one or two small dip(s) remain(s) at one or both opposing exterior ends of the metal filling, for instance due to artefacts which may occur during plating. However, at least 80% (and preferably at least 90%) of the volume of the through hole should be filled with electrically conductive material.

According to an exemplary embodiment of the invention, a component carrier (such as a printed circuit board, PCB) with a dielectric layer in a (preferably laminated) layer stack is provided in which tapering through holes are provided and are completely filled with metallic material. Advantageously, said through holes being located at the same vertical levels may be formed to taper in substantially opposite or antiparallel directions. For example, this may be achieved by laser drilling an electrically insulating layer from not only one, but from both opposing sides to thereby create laser through holes with mutually inverse tapering directions. Advantageously, this manufacturing architecture may ensure a sufficient stiffness of the corresponding dielectric layer and the component carrier as a whole after through hole formation and filling, since the dielectric layer may be filled with a comparable, similar or even identical metal content on both opposing main surfaces thanks to the preferably antiparallel formation of the tapering through holes. A sufficiently stiff dielectric layer with properly defined metal filling may be processed accurately, which translates into a proper precision of the entire component carrier and its sub-structures. Further advantageously, the material of the through hole filling (in particular metallic material of metal-filled laser vias) and the material of one or more connected electrically conductive layer structures (such as plated pads and/or metallic traces, which may be formed by patterned metal foils) may be the same. Such a material selection has advantages: Firstly, by substantially completely filling substantially antiparallel oriented through holes in the same planar dielectric layer with metallic material, the metal density at both opposing main surfaces of the dielectric layer may be rendered very similar or even identical. This reduces or even eliminates an undesired inhomogeneity between dielectric and metallic material in the layer stack, and thereby reduces a CTE (coefficient of thermal expansion) mismatch. Thermal stress created in an interior of the stack by thermal processes during manufacturing and/or during use of the component carrier will thus be significantly reduced. Consequently, undesired phenomena such as warpage and/or delamination of the component carrier may be reduced as well. Furthermore, also stress created by curing shrinkage of resin in an interior of the stack, for instance during lamination and/or reflow processes, may be reduced by the described increase of homogeneity of the material distribution by the essentially antiparallel orientation of metal-filled laser vias in the stack. Secondly, the realization of both the metal filling of the tapering through holes as well as the stack's electrically conductive layer structure(s) of the same material (preferably copper) may keep a number of material bridges between different materials in an interior of the stack very small. In particular, a single metallic material approach of constituting the metal filling of the tapering through holes and the stack's electrically conductive layer structures may also contribute to the reduction of material inhomogeneity within the stack and may keep CTE mismatch small, thereby additionally suppressing the risk of warpage and delamination.

In a nutshell, a gist of an exemplary embodiment of the invention is to drill laser vias on one or more dielectric layers (such as a core of a PCB laminate) from top and bottom side with the purpose to achieve a better copper filling performance, because the laser vias can be copper filled from both sides rather than of one side. This may become particularly advantageous for high density component carrier designs (in particular for high density integration (HDI) applications), since the described architecture allows a tight control and adjustment of the copper thickness without significant deviations from one layer to another.

In the following, further exemplary embodiments of the manufacturing method, and the component carrier will be explained.

In an embodiment, the electrically insulating layer structure with the through holes tapering in opposite directions comprises fully cured resins optionally having reinforcing agents (such as glass fibers of glass spheres) incorporated, in particular is a core. In the context of the present application, the term "core" may particularly denote a rigid plate structure for a component carrier comprising a preferably fully cured dielectric body (such as a central plate) which may be covered on one or both opposing main surfaces thereof with a respective electrically conductive layer structure such as a patterned metal layer. For instance, the dielectric body may comprise resin (for instance epoxy resin) and reinforcing particles (for instance glass fibers or glass spheres), and may for instance be FR4. Optionally, two opposing main surfaces of a core may be electrically coupled with each other by vertical through connections such as copper plated laser vias and/or a mechanically drilled and copper plated via. More specifically, a core of a component carrier such as a printed circuit board (PCB) may be a rigid base material being optionally laminated with copper on one or two sides. Such a core may be used as a starting point for manufacturing single-sided and double-sided boards, but may also be used in the production of multi-layer component carriers (in particular PCBs). Usually, a core is located in a central position of the stack. Strengthening the stiffness of a core in the center of the stack by forming metal-filled tapering through holes with different or opposite tapering directions is of particular advantage for the stiffness of the component carrier as a whole. A vertical symmetry of the component carrier may be improved with a central core is processed in the described way.

In an embodiment, the at least one of the at least one electrically insulating layer structure comprises or consists of a ceramic. Hence, it may also be possible to use ceramics (for instance instead of a core) as dielectric base material. Laser drilling may then be adapted for creating through holes in the ceramic layer structure.

In an embodiment, the at least one of the at least one electrically insulating layer structure having at least partly tapering through holes filled substantially completely with the electrically conductive filling is configured as an inlay-type structure in the component carrier. Correspondingly, the manufacturing method may comprise pre-forming the at least one of the at least one electrically insulating layer structure having through holes tapering in opposite directions and filled substantially completely with the electrically conductive filling as an inlay, and thereafter integrating the inlay in the component carrier. Thus, it may be possible to use pre-manufactured cores (having alternatingly arranged vias) as an inlay-type structure. In this manner, it may be possible to incorporate the inlay wherever it is needed. As the alternatingly arranged vias significantly improve the stiffness of the build-up, it is also possible to use the inlay as a reinforcing structure within the buildup as well.

In an embodiment, the electrically insulating layer structure with the through holes tapering in opposite directions is a central layer structure in the stack. A further build up on both sides of such a strengthened central layer structure may then benefit from the increased stiffness and the high degree of planarity of said central layer structure.

In an embodiment, at least part of the through holes have a frustoconical shape. A through hole with such a geometry may be formed by laser processing with a single laser shot from one side of the corresponding layer structure. Due to the spatially dependent energy impact of the laser beam on the layer structure, the tapering geometry of the through hole results. By arranging through holes with frustoconical shape tapering in opposite directions in the same layer structure, the metal content on both sides thereof may be homogenized, and warpage as well as local stiffness issues may be suppressed.

In an embodiment, at least part of the through holes have a first tapering hole section connected to a second hole section by a kink. A through hole with such a geometry may be formed by laser processing with two subsequent laser shots both from one and the same side of the corresponding layer structure. Due to the spatially dependent energy impact of the laser beam on the layer structure, the kink-type tapering geometry of the through hole results. By arranging kinked tapering through holes in antiparallel directions in the same layer structure, the metallic distribution over the thickness direction of the layer structure may be balanced at least partially. Consequently, warpage as well as local stiffness issues may be reduced.

Thus, the manufacturing method may comprise forming each of the through holes by a single laser shot (resulting in a frustoconical shape) or by two laser shots (resulting in a tapering through hole with kink) from one side of the electrically insulating layer structure.

Still referring to the previously described embodiment, the second hole section may taper with another tapering angle than the first tapering hole section or may be straight. The tapering angles of the different hole sections as well as the vertical extensions of the two hole sections may be defined by correspondingly adjusting the laser properties, for instance intensity and illumination time. By correspondingly adjusting the tapering angles and vertical extensions of the respective hole sections, in combination with the antiparallel tapering directions of different such through holes, a homogeneous metallic distribution may be adjusted with high precision using the described parameters as design parameters.

In an embodiment, at least one further of the at least one electrically insulating layer structure has further at least partly tapering through holes filled substantially completely with further electrically conductive filling, wherein different ones of the further through holes are tapering in opposite directions, and wherein the further electrically conductive filling is made of the same material as the at least one electrically conductive layer structure and the electrically conductive filling. Descriptively speaking, multiple dielectric layer structures—such as cores—may each be provided with tapering through holes of opposite tapering directions. Each of said dielectric layer structures may be processed by a laser beam from both opposing main surfaces for forming the tapering through holes of opposite tapering directions. After metal filling of said through holes, multiple of such dielectric layer structures may be connected with each other, for instance by lamination or gluing. As a result, a component carrier is obtained in which a plurality of electrically insulating layer structures with inversely tapering metal-filled through holes may be provided. Such a component carrier has excellent properties in terms of homogeneous stiffness, and suppression of warpage and delamination.

In an embodiment, the through holes are arranged so that a material distribution of electrically conductive filling on both opposing main surfaces of the electrically insulating layer structures is substantially homogeneous. For example, a metallic area on one side of an electrically insulating layer structure with metal-filled through holes of opposite tapering directions may be the same (or may deviate by for instance less than 5%) from a metallic area on the other side of the electrically insulating layer structure. Both stiffness as well as protection against warpage and delamination of such a component carrier may be excellent.

In an embodiment, the through holes are arranged so that a heat removal capability is substantially the same on both opposing main surfaces of the electrically insulating layer structure. A skilled person is aware of the fact that, in a component carrier, metallic material has a significantly higher value of the thermal conductivity than typical dielectrics and thereby dominates by far the heat removal properties of the component carrier. By implementing metal-filled through holes of opposite tapering directions in a dielectric layer of a component carrier with a substantially balanced metal distribution on both opposing main surfaces of said dielectric layer, the heat dissipation performance may be substantially identical on both opposing main surfaces, which prevents undesired hotspots in an interior of the component carrier. As a result, the component carrier is less prone to thermal stress and therefore shows a proper thermal performance. Advantageously, the described measure also ensures that an effective CTE (coefficient of thermal expansion) value may be substantially identical on both sides of the dielectric layer.

In an embodiment, the through holes of one electrically insulating layer structure are arranged with alternating tapering directions along a horizontal direction or in a horizontal plane. For instance, a linear array of through holes may be formed in an electrically insulating layer structure along a horizontal direction, wherein the through holes are alternatingly formed to taper upwardly or downwardly. Further advantageously, it may be possible to form a two-dimensional array of through holes in which alternating sequences of upwardly and downwardly tapering through holes are formed in two orthogonal horizontal directions, i.e., in accordance with a two-dimensional through hole pattern. The latter measure may ensure a two-dimensional homogeneity of metal on both sides of the dielectric layer structure.

In an embodiment, the through holes of one preferably planar electrically insulating layer structure filled with an electrically conductive through hole filling have coplanar ends on both opposing main surfaces of the electrically insulating layer structure. In other words, each of the through holes extending through a planar electrically insulating layer structure may have the same vertical start position and the same vertical end position. This may ensure a proper definition of the metal-to-dielectric relationship in each plane. It is however alternatively also possible that metal-filled through holes with mutually inverse tapering direction only have an overlap in vertical direction, but are somewhat displaced vertically with respect to each other.

In an embodiment, a thickness of the electrically insulating layer structure is less than 120 μm, in particular is in a range from 50 μm to 80 μm. This may ensure that each of the through holes can be formed with a single laser shot extending through the entire thickness of the electrically insulating layer structure, and hence in a fast and efficient way. When using thicker fully cured resin layers, cores, ceramic structures, etc., tapering through holes may also be formed by carrying out two or more than two laser shots from one side.

In an embodiment, a difference between a ratio between an electrically conductive surface area and an entire surface area at one of the two opposing main surfaces of the electrically insulating layer structure and a ratio between an electrically conductive surface area and an entire surface area at the other one of the two opposing main surfaces of the electrically insulating layer structure is less than 25%, in particular is less than 14%, preferably is less than 9%. It has turned out that with this high degree of metallic homogeneity, the stiffness of the layer structure is sufficient to ensure a proper processing during component carrier manufacture. Moreover, this may lead to very similar heat removal characteristics at both main surfaces of the dielectric layer.

In an embodiment, the stack comprises at least one further electrically insulating layer structure having further through holes filled with further electrically conductive filling and tapering all in the same direction. In particular, the stack may comprise at least two further electrically insulating layer structures between which the first mentioned electrically insulating layer structure is arranged, wherein each of the at least two further electrically insulating layer structures has a set of further through holes filled with further electrically conductive filling, wherein the further through holes of each respective set taper all in the same direction, and wherein the further through holes of different sets taper in opposite directions. After having constructed for instance a core with metal-filled through holes of mutually inverse tapering directions by laser processing from both sides, a further build-up of at least one further electrically conductive layer structure and/or at least one further electrically insulating layer structure may be formed on both sides of the core or other kind of central electrically insulating layer structure. In particular, a (for instance mirror-) symmetric build-up on both sides of said central electrically insulating layer structure may be advantageous for suppressing warpage and delamination. However, laser processing can then only be carried out from one side, which results in through holes of such additional electrically insulating layer structures which all taper in the same direction. Such a structure can be manufactured with low effort.

The described configuration of vias can be obtained in any layer of the stack. Where such a configuration is placed may be related to the design and whether or not the design is prone to undergo warpage, mechanical stability issues or thermal stress. In particular, the core having alternatively arranged vias may be manufactured as an inlay and can be placed anywhere in the stack.

In an embodiment, each through hole has a maximum diameter of less than 110 μm, in particular less than 55 μm. For example, said maximum diameter may be in a range between 30 μm and 110 μm, in particular in a range from 40 μm to 100 μm. In particular, a difference between a maximum diameter and a minimum diameter of a respective through hole divided by the maximum diameter may be in a range from 10% to 30%, in particular in a range from 15% to 25%. Such a geometry can be achieved by laser drilling of through holes.

In an embodiment, a number of through holes in the electrically insulating layer structure per square millimeter is in a range from 0.5 to 5, or even more. In particular for high-intensity integration (HDI) applications with a large number of through holes per area or volume, the concept of providing metal-filled through holes extending through an electrically insulating layer structure and tapering in opposite directions is of utmost advantage. This keeps stiffness, thermal conductivity, and CTE mismatch at reasonable values and thereby ensures a high performance and precision of the manufactured component carrier.

Additionally, by alternatingly arranging copper filled vias, a higher copper density may be achieved as the distance between the vias can become smaller (descriptively speaking, they may be closer arranged to each other). As a result, space inside the PCB may be saved and more functionality can be integrated.

In an embodiment, the component carrier comprises a component embedded in or surface-mounted on the stack and being electrically coupled, in particular directly, to the electrically conductive filling. In the context of the present application, the term "component" may particularly denote an inlay, for instance fulfilling an electronic and/or a thermal task. For instance, the component may be an electronic component. Such an electronic component may be an active component such as a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die. A region in a component carrier in which a component is embedded (in particular when manufactured of a semiconductor material such as silicon), is usually a weak point in terms of mechanical and thermal reliability. In particular, a CTE mismatch around an embedded semiconductor component may be pronounced and may lead to delamination and warpage issues in the presence of thermal loads. An embedded component may be a main heat source in a component carrier, and the embedded component may be critical also in terms of thermal reliability. By coupling electrically conductive pads of the embedded (in particular semiconductor) component with metal-filled through holes of opposite tapering directions, the mechanical and thermal reliability may be high even under harsh conditions. Also contacting pads of a surface-mounted component may be possible by metal-filled through holes tapering in opposite directions.

In an embodiment, the method comprises forming a first number of the through holes by laser drilling from a first side of the electrically insulating layer structure, and forming a remaining second number of the through holes by laser drilling from an opposing second side of the electrically insulating layer structure. After having formed the first number of through holes from a front side and before forming the second number of through holes from a back side of the electrically insulating layer structure, the electrically insulating layer structure may be flipped, i.e., may be turned upside down. This may ensure that the laser source may remain on a fixed side of the electrically insulating layer structure, which has a positive impact on the accuracy of the through hole formation. Furthermore, through holes with opposite tapering directions may result from such a processing.

In an embodiment, the method comprises defining a number of laser through holes to be formed in the electrically insulating layer structure, and calculating an arrangement and a tapering direction of the individual through holes in the electrically insulating layer structure so that a distribution of the electrically conductive filling which fills the through holes is homogenized on both opposing main surfaces of the electrically insulating layer structure. In this context, "homogenizing" may denote the fact that the distribution of the electrically conductive filling is more homogeneous with through holes tapering in opposite directions according to the calculated arrangement as compared to a scenario in which all through holes of an electrically insulating layer structure taper in the same direction. Thus, according to an exemplary embodiment of the invention, a calculation logic for equilibrating or homogenizing the copper distribution at opposing main surfaces of a dielectric layer, such as a core, may be carried out when designing a component carrier.

For example, such a calculation logic may firstly define a drill program to be executed. The algorithm may then calculate, in particular related to the applied design and its functionality, a distribution of a metal filling of the tapering through holes at the upper main surface and at the lower main surface of the dielectric layer to be processed. Over the entire main surface or selectively over a special sub-region thereof (for instance a bore region of high density of bore holes per area or volume), the surface area of the bore holes may be divided between the upper and lower main surfaces. For instance, an alternating sequence of tapering through holes with larger surface area and smaller surface area may be defined, for instance concerning a one-dimensional sequence of tapering through holes or concerning a two-dimensional array of tapering through holes. Preferably, the dimensions of all through holes of one dielectric layer may be the same, because this may simplify the plating process for filling the tapering through holes entirely with metallic material. By homogenizing the metal distribution between both opposing main surfaces of a dielectric layer being penetrated by a plurality of antiparallel tapering through holes, also the heat removal capability via both opposing main surfaces may be rendered more balanced, which avoids undesired hotspots in the interior of a component carrier. Thus, also the thermal management may be improved by the antiparallel tapering of through holes.

In an embodiment, the component carrier comprises at least 1,000 through holes, in particular at least 10,000 through holes. For example, a panel (which may have dimensions of 515×515 mm$^2$) used for manufacturing high density printed circuit boards may implement at least 100,000 tapering through holes, for instance about 800,000 tapering through holes. In lower-density applications, the number of through holes per component carrier may be for example in a range from 50 to 5,000. A typical number of boreholes of a component carrier having a dimension of 12×16 mm$^2$ may be several hundreds. In particular for applications having a relatively large number of tapering through holes per component carrier, the antiparallel orientation of tapering through holes in a respective planar dielectric layer may be of utmost advantage. For example, it may be possible to fit about 6,400 vias in an area of 10×10 mm$^2$ assuming a center-to-center distance between adjacent vias of 125 µm.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), called vias or the filled hole connects at least two electrically conductive layers. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photo-imagable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether (PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photo-imagable dielectric materials, may be used as well. For high frequency applications, high-frequency materials such as PTFE, LCP and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular materials coated with supra-conductive material or conductive polymers, such as graphene or poly (3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one pn junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as a component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 1 illustrates a cross-sectional view of a component carrier according to an exemplary embodiment of the invention.

FIG. 2 illustrates a cross-sectional view of a component carrier according to another exemplary embodiment of the invention.

FIG. 3 illustrates a plan view of a conventional component carrier.

FIG. 4 illustrates a plan view of a component carrier according to an exemplary embodiment of the invention.

FIG. 8 compares a layer design of a component carrier according to an exemplary embodiment of the invention with a layer design of a conventional component carrier.

FIG. 9 and FIG. 10 show experimental setups for analyzing component carriers according to an exemplary embodiment of the invention as well as conventional component carriers.

FIG. 11 illustrates a cross-sectional view of a component carrier according to another exemplary embodiment of the invention.

FIG. 12 illustrates a cross-sectional view of a component carrier according to still another exemplary embodiment of the invention.

DETAILED DESCRIPTION OF ILLUSTRATED EMBODIMENTS

Figure 5:
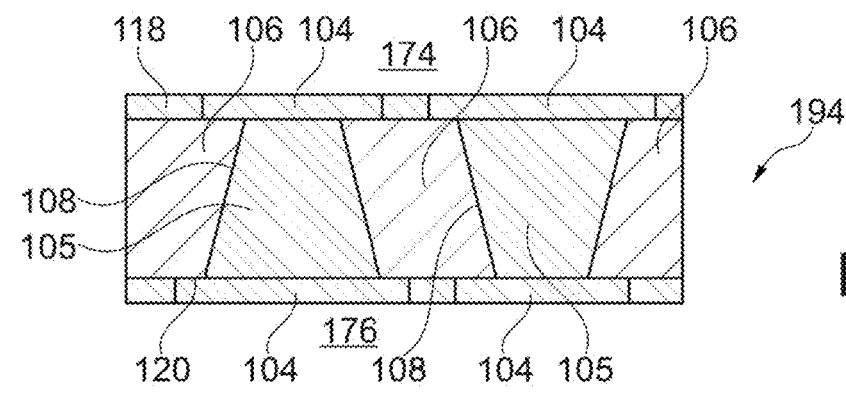
FIG. 5 illustrates a cross-sectional view of a pre-fabricated inlay to be embedded in or surface mounted on a component carrier according to still another exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

Conventionally, laser vias in a core of a printed circuit board are only drilled from one main surface of a dielectric layer. Traditionally, all laser vias of a laminate or core are thus drilled from one side only. In particular on very high laser density designs and depending on the laser via size, this may create a challenge to control the copper surface thickness in case of copper filled vias. Generally, mechanical reliability and accuracy of a manufactured component carrier may thus be limited.

According to an exemplary embodiment of the invention, laser-drilled through holes in an electrically insulating layer of a laminated stack of a component carrier such as a PCB are not formed from one side only, but different groups of through holes are formed from different ones of the opposing main surfaces of said electrically insulating layer. This may result in through holes in the same dielectric layer with opposite tapering directions. Consequently, a subsequent plating process for filling the tapering through holes with opposite tapering directions with a metal such as copper may ensure a more homogeneous material distribution of resin and metal at both opposing main surfaces of the dielectric layer with the metal-filled tapering through holes of opposite tapering direction. Preferably, said dielectric layer may be a central core of the stack. Descriptively speaking, a drill program for laser drilling during formation of metal-filled laser vias may be divided between both opposing main surfaces of the dielectric layer. Consequently, no or no noteworthy thickness difference of the dielectric layer will occur after filling the laser through holes with metal. Exemplary embodiments of the invention are based on the finding that in particular in the scenario of a drill program with high drill hole density (i.e., a high number of laser through holes formed per volume or area of a layer stack), a strongly inhomogeneous copper filling of laser drilled through holes may lead to stiffness issues of the corresponding dielectric layer, which may result, in turn, in secondary problems for instance during soldering. Furthermore, the described measures may also allow a highly precise etching of electrically conductive traces on a surface of the mentioned dielectric layer and/or on other dielectric layers, since no accuracy issues may occur on the thinner side. In particular for thin component carriers and high copper densities, the described manufacturing architecture may be highly advantageous, in particular since embodiments allow to manufacture a higher copper density. This is related to a decreasing distance between alternatingly arranged copper vias allowing more vias to be obtained on the same space. Exemplary embodiments may in particular ensure that minimum copper thicknesses can be guaranteed, so that a high stiffness may be ensured as well. This simplifies processing of the layer, of the stack, and of the component carrier as a whole.

For instance, the described manufacturing architecture may also allow to increase the copper thickness of both opposing main surfaces of the dielectric layer. This may be problematic in a conventional alignment with laser drilling from one side of the dielectric layer only, since it may be difficult to obtain a sufficient thickness on the copperdepleted side. In particular, the described manufacturing architecture may also allow to use the core as a sort of inlay, which can be incorporated within a build-up at any position ensuring proper heat distribution and stability where needed.

Preferably, the manufacturing process may first drill the entire subset of the through holes which shall have their wide end on one main surface. Thereafter, the dielectric layer may be flipped. After that, the manufacturing process may be continued by drilling the entire remaining subset of the through holes which shall have their narrow end on said one main surface. Subsequently, all through holes may be filled with metal, for instance by a combination of electroless deposition for forming a seed layer and electro-plating for forming bulk metal for completely filling the through holes.

According to an exemplary embodiment of the invention, alternating top and bottom drilled copper filled laser vias may be formed in a core. Hence, not the individual through holes are to be drilled from both sides, but each half of through holes from one side (for instance the top side) and the other half from the other side (for example the bottom side). Descriptively speaking, an exemplary embodiment of the invention may split the core laser drill quantity and have it drilled from top and bottom side alternatingly. More specifically, core laser drilling may be carried out for instance alternatingly with a laser on top and bottom side of a dielectric layer with the purpose to achieve a better copper filling performance. Advantageously, the laser vias in a dielectric layer can be copper filled from both sides. Thus, it may be simply possible to split the core laser drill quantity and have it drilled partially from the top side and partially from the bottom side. The, as such, manufactured pre-structure can then be used as an inlay-type structure to be incorporated at any desired position.

Exemplary embodiments of the invention may have the advantage to provide a better condition for the following copper filling process of the laser vias. Instead of filling the laser vias only from one side (where one side will typically result in less copper thickness than the second side), an exemplary embodiment drills a sequence of laser vias for instance alternatingly from the top side and from the bottom side. After plating, the laser vias can be equally copper filled on both sides with the result of nearly the same copper thickness on both sides. Especially for thin stackups, a small form factor, high density designs, etc., where stiffness becomes challenging, already a few microns difference can show some impact to solder joint related failures. Not only does it have a mechanical advantage, but it may also allow better conditions for the etching process to ensure less deviation between the two layers, all owing a more consistent design. A further benefit may be an improved signal integrity, in particular in terms of impedance, signal loss, resistance, etc.

Exemplary embodiments may be applied particularly advantageously to thin HDI (high-density integration) component carriers with small form factor, where stiffness and mechanical strength is of particular importance. Component carriers for which consistent copper thickness and trace width geometry on core layers are of particular relevance are HDI component carriers, any layer component carriers, substrate-like PCBs (SLPs), and modules.

According to exemplary embodiment of the invention, a laser core drill adaptation may be made to a two-sided laser drilling of a dielectric layer such as a core. This may improve copper thickness balance between the top side and the bottom side of the core, which may have advantages especially for high density designs. A further advantage of exemplary embodiments is a better etching performance and the option of trace widths variation. Furthermore, the stiffness of the metal-filled dielectric layer can be increased, which helps during the module assembly. Furthermore, this may reduce solder joint related failures. The stiffer property of the PCB may also help to reduce the overall warpage. For instance, exemplary embodiments of the invention may be advantageously implemented in wireless modules (for instance having a form factor of 10×10 mm$^2$). Furthermore, an increase of the manufacturing efficiency may be achieved at the final module assembly through yield improvement.

FIG. 1 illustrates a cross-sectional view of a component carrier 100 according to an exemplary embodiment of the invention.

The component carrier 100 according to FIG. 1 may be configured as a substantially plate-shaped printed circuit board (PCB). Thus, the component carrier 100 shown in FIG. 1 may be highly compact in a vertical direction. More specifically, the component carrier 100 may comprise a layer stack 102 comprising electrically conductive layer structures 104 and/or electrically insulating layer structures 106. Each of the electrically conductive layer structures 104 may comprise a layer section (for instance a continuous or structured copper foil). The electrically insulating layer structures 106 may comprise a respective resin (such as a respective epoxy resin), optionally comprising reinforcing particles therein (for instance glass fibers or glass spheres). For instance, the electrically insulating layer structures 106 may be made of FR4.

According to FIG. 1, the central electrically insulating layer structure 106 has tapering through holes 108 filled completely with an electrically conductive filling 105, which is made of copper. Due to their manufacture by laser drilling with a single laser shot from one side of the electrically insulating layer structure 106, the through holes 108 have a frustoconical shape. Said tapering through holes 108 with their metallic filling 105 form vertical through connections in the component carrier 100, and are preferably embodied as copper filled laser vias which may be created by laser drilling and subsequent plating. Advantageously, the planar-shaped electrically conductive layer structures 104 and the electrically conductive filling 105 are made of the same material, i.e., copper in the shown embodiment. This prevents undesired metallic bridges in an interior of the component carrier 100.

Further advantageously, adjacent ones of the through holes 108 of the central electrically insulating layer structure 106 are tapering in opposite directions. In FIG. 1, a downwardly oriented tapering direction is shown with reference sign 170, whereas an upwardly oriented tapering direction is shown with reference sign 172. More specifically, the through hole 108 of the central electrically insulating layer structure 106 on the left-hand side of FIG. 1 tapers downwardly, the horizontally central through hole 108 tapers upwardly, and the through hole 108 of the central electrically insulating layer structure 106 on the right-hand side of FIG. 1 tapers downwardly, and so on (the component carrier 100 can continue to the left and/or to the right). Such a geometry may be manufactured by laser drilling all downwardly tapering through holes 108 by laser drilling from the top side of the central electrically insulating layer structure 106, whereas all upwardly tapering through holes 108 may be created by laser drilling from the bottom side of the central electrically insulating layer structure 106. By configuring the central electrically insulating layer structure 106 with an array of metal-filled through holes 108 tapering alternatingly in opposite directions, the metal density at both opposing main surfaces of said central electrically insulating layer structure 110 may be rendered more homogeneously as compared to a scenario in which all metal-filled through holes 108 would taper along the same direction. Consequently, a metal-depleted main surface of said central electrically insulating layer structure 106 may be prevented. Consequently, the central metal-filled electrically insulating layer structure 106 shows a homogeneous stiffness without regions of local stiffness issues which may improve the mechanical integrity by an anchoring effect. As a result, processing accuracy of said central electrically insulating layer structure 106 during manufacture of the component carrier 100 may be high, and undesired artefacts such as delamination and/or warpage may be reliably prevented.

In the shown embodiment, the electrically insulating layer structure 106 with the through holes 108 tapering in opposite directions is a core 110 made of fully cured dielectric material, such as epoxy resin with reinforcing glass fibers (also denoted as FR4).

As already mentioned, the through holes 108 in the central electrically insulating layer structure 106 are completely filled with a metal such as copper. This can be accomplished by plating after formation of the laser through holes 108. More specifically, the bulky electrically conductive filling 105 of the through holes 108 may be formed by electroplating after having created a metallic seed layer. For galvanic deposition or electroplating of the major part of the electrically conductive filling 105, water-based solutions or electrolytes may be used which contain metal to be deposited as ions (for example as dissolved metal salts). An electric field between a first electrode (in particular an anode) and a preform of the component carrier 100 to be manufactured as second electrode (in particular a cathode) may force (in particular positively charged) metal ions to move to the second electrode (in particular cathode) where they give up their charge and deposit themselves as metallic material on the surface of the preform of the component carrier 100, to thereby form the plating structure. One or more galvanic plating stages may be carried out for ensuring complete filling of the entire through holes 108. Before electroplating, a seed layer may be formed by another process (for instance by sputtering or electroless deposition) for lining the surface of the through holes 108 with metal. For instance, a very thin metallic seed layer which may function as an electrode of the preform of the component carrier 100 to be metal filled by galvanic deposition may be formed by sputtering or electroless deposition.

Advantageously, the through holes 108 in the core-type central electrically insulating layer structure 106 are arranged so that a material distribution of electrically conductive filling 105 on both opposing main surfaces 118, 120 of the electrically insulating layer structures 106 is at least partially homogenized by the antiparallel tapering in accordance with tapering directions 170, 172. As shown, the through holes 108 of said central electrically insulating layer structure 106 filled with electrically conductive filling 105 have co-planar ends on both opposing main surfaces 118, 120 of the electrically insulating layer structure 106. This allows to properly define the metal content on both opposing main surfaces 118, 120 in an accurate way. This improves the mechanical integrity. Furthermore, the through holes 108 may be arranged so that a heat removal capability is substantially the same on both opposing main surfaces 118, 120 of the electrically insulating layer structure 106. Since the thermal conductivity of copper is significantly better than of the resin matrix and glass fibers of the electrically insulating layer structure 106, the capability of removing heat out of the component carrier 100 is dominated by copper material. In order to avoid undesired hotspots in regions with poor thermal conductivity inside the component carrier 100, the inverse tapering directions of the copper-filled laser vias may improve the equal distribution of thermally conductive regions inside of the component carrier 100. Highly advantageously, this simultaneously reduces a CTE (coefficient of thermal expansion) mismatch inside of the component carrier 100 and thereby improves the thermal performance of the component carrier 100. Furthermore, delamination issues may be prevented.

Thus, the through holes 108 of the central electrically insulating layer structure 106 are arranged with alternating tapering directions 170, 172 (i.e., upwardly and downwardly) along a horizontal direction in the paper plane of FIG. 1. Although not shown in FIG. 1, it is also possible that the electrically conductive filling 105 of the through holes 108 in the central electrically insulating layer structure 106 are arranged with alternating tapering directions in the entire horizontal plane, i.e., also along a horizontal direction perpendicular to the paper plane of FIG. 1. Thus, an alternating tapering direction-type two-dimensional array of through holes 108 may be formed in the core-type central electrically insulating layer structure 106 according to FIG. 1. This may further improve the homogeneity of the metal distribution on both opposing main surfaces of the electrically insulating layer structure 106, and therefore the mechanical and thermal performance.

As shown in FIG. 1 as well, the stack 102 comprises two further electrically insulating layer structures 106 on the top-side and on the bottom-side of the core 110, i.e., between which the central electrically insulating layer structure 106 is arranged. Each of these two further electrically insulating layer structures 106 has a set of further through holes 108 (only one of which being shown in FIG. 1) filled with further electrically conductive filling 105, i.e., copper. The further through holes 108 (only one of which being shown for each of the two further electrically insulating layer structures 106 in FIG. 1) of each respective set taper all in the same direction. More specifically, the uppermost electrically insulating layer structure 106 of FIG. 1 has only downwardly tapering through holes 108, whereas the lowermost electrically insulating layer structure 106 of FIG. 1 has only upwardly tapering through holes 108. Thus, the further through holes 108 of the different sets taper in opposite directions. The further electrically insulating layer structures 106 with their metal filled further through holes 108 can be manufactured by laminating further dielectric sheets (such as prepreg or resin sheets) to the processed central electrically insulating layer structure 106, followed by laser drilling from the respectively exposed dielectric main surface and by plating (as described above).

For instance, a thickness L of the core-type electrically insulating layer structure 106 may be 70 µm. This allows formation of the through holes 108 by only one laser shot. For example, each tapering through hole 108 may have a maximum diameter D in a range from 50 µm to 90 µm, and a minimum diameter d in a range from 35 µm to 70 µm.

Advantageously, a difference of a ratio between an electrically conductive surface area and an entire surface area at the two opposing main surfaces 118, 120 of the central electrically insulating layer structure 106 may be less than 9%. With such a homogeneous metal distribution, a sufficient stiffness of the central electrically insulating layer structure 106 may be obtained on both sides, and very similar heat removal characteristics at both main surfaces 118, 120 may be achieved as well.

For instance, a number of through holes 108 in the central electrically insulating layer structure 106 per square millimeter surface area is in a range from 1 to 3. In total, the component carrier 100 may comprise at least 1,000 through holes 108. The component carrier 100 according to FIG. 1 may be manufactured in HDI (high-density integration) technology, so that a homogeneous metal distribution is of utmost advantage for the mechanical and thermal integrity.

For manufacturing the component carrier 100 according to FIG. 1, the laser vias of the laminate or core may be drilled from both sides. This allows for a balanced copper surface thickness.

FIG. 2 illustrates a cross-sectional view of a component carrier 100 according to another exemplary embodiment of the invention.

In addition to the tapering vertical through connections of the embodiment of FIG. 1, the embodiment of FIG. 2 additionally comprises a non-tapering vertical through connection 124. Non-tapering vertical through connection 124 has a cylindrical geometry and may be formed by mechanically drilling and a subsequent plating process. In the shown embodiment, the non-tapering vertical through connection 124 extends vertically over a plurality of electrically insulating layer structures 106 and over a plurality of tapering through holes 108.

FIG. 3 illustrates a plan view of a conventional component carrier 100'. According to FIG. 3, all metal-filled tapering through holes 108' taper in the same direction and are formed by laser drilling from the same main surface.

FIG. 4 illustrates a plan view of a component carrier 100 according to an exemplary embodiment of the invention. According to FIG. 4, some of the tapering through holes 108 taper in a first direction perpendicular to the paper plane of FIG. 4, as indicated schematically by reference sign 170. The other tapering through holes 108 taper in a second direction perpendicular to the paper plane of FIG. 4 and antiparallel to the first tapering direction, as indicated schematically by reference sign 172. The first part of the tapering through holes 108 are formed by laser drilling from a first main surface 118 of a respective electrically insulating layer structure 106, whereas the second part of the tapering through holes 108 are formed by laser drilling from an opposing second main surface 120 of the respective electrically insulating layer structure 106.

Advantageously, the through holes 108 of the component carrier 100 according to FIG. 4 are arranged so that a material distribution of electrically conductive filling material in the through holes 108 on both opposing main surfaces 118, 120 of the electrically insulating layer structures 106 is partially homogenized. This may allow to arrange the through holes 108 so that both stiffness and a heat removal capability are similar on both opposing main surfaces 118, 120 of the electrically insulating layer structure 106. Furthermore, a CTE mismatch may be kept in acceptable limits by more equally distributing metal-filled through holes 108 with both opposing tapering directions in the component carrier 100.

FIG. 5 illustrates a cross-sectional view of an inlay 194 to be embedded in or surface mounted on a component carrier 100 according to still another exemplary embodiment of the invention.

The illustrated inlay 194 may be pre-formed to comprise an electrically insulating layer structure 106 (for instance made of resin and optionally reinforcing particles, or made of a ceramic) having through holes 108 tapering in opposite directions and filled substantially completely with the electrically conductive filling 105. Thereafter, the pre-formed or pre-fabricated inlay 194 may be connected with or in a component carrier 100, for instance by embedding or surface mounting. The inlay 194 may also comprise one or more further constituents.

To manufacture the inlay 194 of FIG. 5, a laminated layer stack is formed of electrically conductive layer structures 104 (here embodied as patterned copper foils) and an electrically insulating layer structure 106 (such as a resin or prepreg sheet). Tapering through holes 108 are formed in the shown electrically insulating layer structure 106 by laser drilling in such a way that different ones of the through holes 108 in this electrically insulating layer structure 106 are tapering in opposite directions. Thereafter, the through holes 108 are filled with an electrically conductive filling 105 made of the same material, preferably copper, as the electrically conductive layer structures 104.

More specifically, a first number of the through holes 108 may be formed by laser drilling from a first side 174 (for instance the top side according to FIG. 5) of the electrically insulating layer structure 106. A remaining second number of the through holes 108 can be formed by laser drilling from an opposing second side 176 (for instance the bottom side according to FIG. 5) of the electrically insulating layer structure 106. Each of the through holes 108 is formed by a single laser shot from one side of the electrically insulating layer structure 106 which results in the shown frustoconical shape of the through holes 108.

For ensuring a continuous stiffening of the obtained inlay 194 or a corresponding component carrier 100 and for suppressing artefacts such as warpage and delamination, a number of laser through holes 108 to be formed in the electrically insulating layer structure 106 is firstly defined. Thereafter, an arrangement and a tapering direction of the individual through holes 108 in the electrically insulating layer structure 106 is calculated so that a distribution of the electrically conductive filling 105 filling of the through holes 108 is substantially homogeneous on both opposing main surfaces 118, 120 of the electrically insulating layer structure 106.

Functional requirements of the inlay 194 or component carrier 100 to be manufactured can be considered as well for defining the position and tapering direction of the individual laser through holes 108. These functional requirements may be summarized in a set of design data indicating the properties of the inlay 194 or component carrier 100 to be manufactured. Advantageously, said design data may comprise Computer-Aided Manufacturing (CAM) data defining the component carriers to be manufactured by a manufacturing apparatus and/or a corresponding manufacturing process. In a preferred embodiment, CAM may be implemented in a component carrier manufacturing apparatus as a software-based system to control the manufacture of component carriers. In such a CAM system, it may be possible to use assistance by a computer in operations of the manufacturing apparatus, including planning, management, transportation and/or storage.

Figure 6:
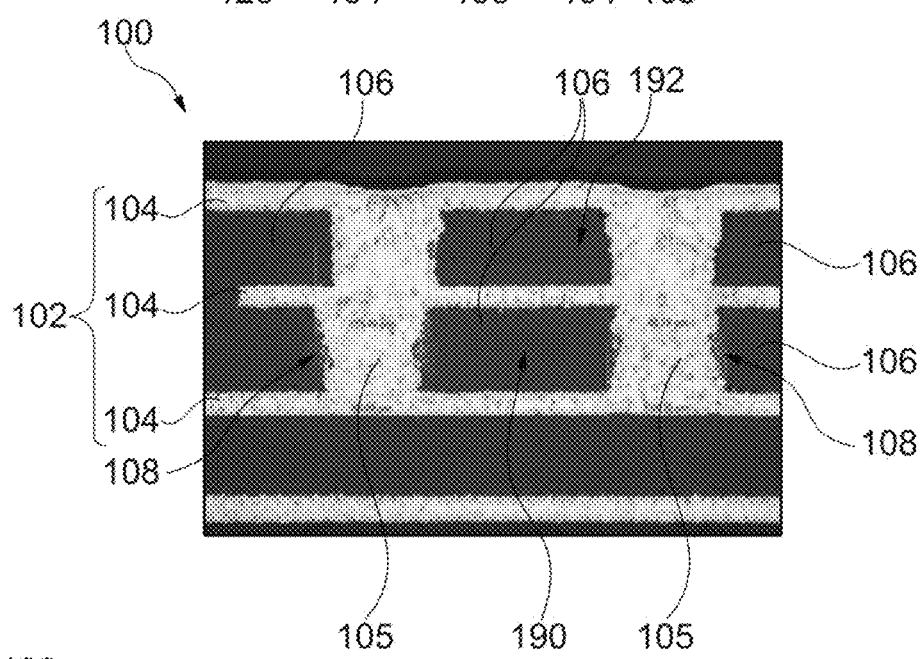
FIG. 6 illustrates a cross-sectional image of a manufactured component carrier according to an exemplary embodiment of the invention.
Figure 7:
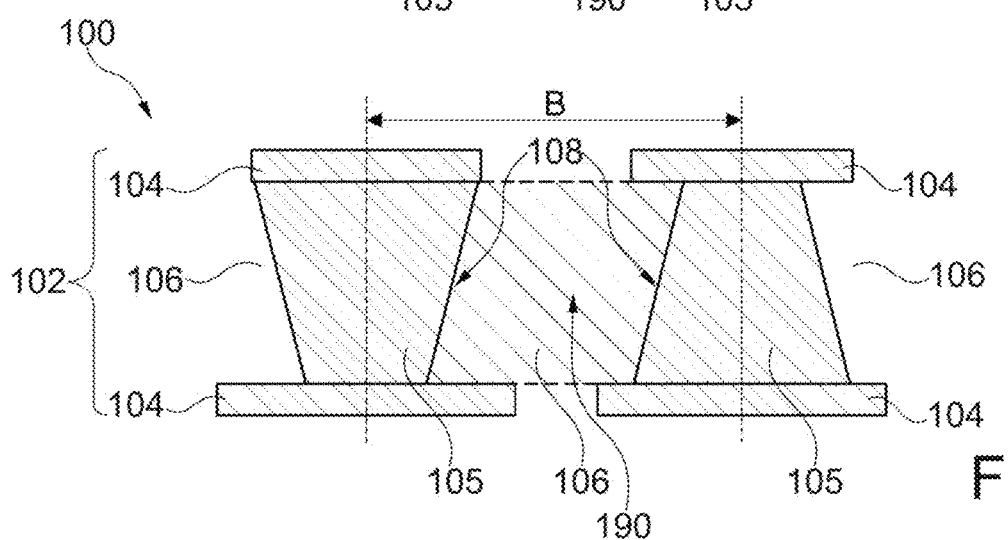
FIG. 7 illustrates a schematic cross-sectional view of a component carrier according to an exemplary embodiment of the invention with characteristics according to FIG. 6.

FIG. 6 illustrates a cross-sectional image of a manufactured component carrier 100 according to an exemplary embodiment of the invention. FIG. 7 illustrates a schematic cross-sectional view of a component carrier 100 according to an exemplary embodiment of the invention with characteristics according to FIG. 6.

The experimental image of FIG. 6 and the schematic illustration of FIG. 7 indicate specific characteristics of component carriers 100 manufactured with the concepts described herein.

Firstly, adjacent through holes 108 tapering in opposite directions may be produced with a very small center-to-center distance B of not more than 125 µm, in particular of not more than 100 µm. This contributes advantageously to the miniaturization of component carriers 100. Such a decreased distance, compared to conventional approaches, between vias may become possible due to the applied method. For instance, a via center to via center distance of 125 µm may be achieved in combination with a pad size of 100 µm, a 50 µm via and a pad to pad spacing of 25 µm. Such a design rule may also allow to obtain a metal-filled tapering through hole density of 60 vias per square millimeter, or more.

Secondly, a portion 190 (highlighted in FIG. 7) of the electrically insulating layer structure 106 between the adjacent through holes 108 tapering in opposite directions has a substantially rhombic shape in a cross-sectional view. Both FIG. 6 and FIG. 7 illustrate the rhombus-like shape of the hardened resin between the two vias. It may also be possible to increase the surface roughness of the resin by correspondingly adjusting the laser process. It is believed that such a rhombic dielectric region between adjacent vias tapering in opposite direction has a stabilizing effect, and reduces a tendency of delamination and warpage.

Referring now to the upper portion of FIG. 6 and here in particular reference sign 192, conventionally processed vias may lead to a square-shaped resin structure. Conventionally fabricated vias tend to delaminate at the bottom, where the stress concentrates. At the bottom, the contact area may be decreased leading to less adhesion. By arranging the vias alternatingly according to an exemplary embodiment of the invention, the contact area on both sides is the same and delamination at the bottom of vias may be limited as well. The alternatingly arranged vias therefore result in a better mechanical anchoring of the vias. Therefore, it may also be possible to use the method as described for producing inlays. Besides using them for thermal management, it may be possible to locally increase the stiffness. The anchoring effect can be achieved by the resin between the vias, having a rhombus-like shape. The shape of the hardened resin may increase the stiffness and decrease the occurrence of delamination. FIG. 6 and FIG. 7 show a rhombus-like structure with reference sign 190.

Furthermore, the adhesion can be even more improved, when increasing the surface rough-ness of the vias, for example by adjusting the laser drilling process.

FIG. 8 compares a layer design of a component carrier according to an exemplary embodiment of the invention with a layer design of a conventional component carrier.

Reference sign 130 indicates four copper layers of a component carrier specification under analysis. Reference sign 132 indicates a nominal copper thickness (in micrometer) of a respective copper layer. Reference sign 134 indicates a corresponding lower limit while reference sign 136 indicates a corresponding upper limit of a respective copper layer thickness.

Reference sign 138 relates to a lot of conventional component carriers with regular laser vias drilled by one side. In contrast to this, reference sign 140 relates to a lot of component carriers according to an exemplary embodiment of the invention corresponding to a laser via formation with a drilling from both sides.

Reference sign 142 is indicative of a bend deflection (more specifically a 3pt bend deflection at a force of 10 N).

Comparing the results according to reference signs 138 and 140, it can be concluded that the component carriers according to an exemplary embodiment of the invention were in better compliance with the target specification than the conventional component carriers. Hence, there is a correlation between stiffness and accuracy of the copper thickness. Thus, FIG. 8 provides results concerning $3pt$ bend tests which confirm that the improved stiffness (when the copper thickness is higher) has a positive correlation when the alternate laser via solution according to an exemplary embodiment of the invention is applied. Advantageously, the deflection can be decreased due to a higher stiffness.

FIG. 9 and FIG. 10 show experimental setups for analyzing component carriers 100 according to an exemplary embodiment of the invention as well as conventional component carriers 100'. The setup according to a FIG. 9 and FIG. 10 may be applied for obtaining the measurement results according to FIG. 8.

Referring to FIG. 9 and FIG. 10, a more detailed description with respect to the metrology and the interpretation of the data according to FIG. 8 will be given. For this purpose, the measurement set-up will be described.

The sample (i.e., component carrier 100/100') is placed on a sample holder 144. Afterwards the sample is loaded at three positions by exerting a force F to the respective component carrier 100/100'. The sample is placed with its opposing ends on the sample holder 144 while the load is applied in the middle of the sample. The measurement setup is like in FIG. 9. At the supported area, the sample will be inevitably loaded as well, that is why the test may be called a three-point bending test. FIG. 9 shows a real test setup corresponding to the schematic setup according to FIG. 10.

The load (in N) is related to the applied stress (in N/mm2) and the deflection as compared to the non-loaded position is measured. The deflection is related to the strain (%). The deflection is measured in mm.

The results show that the deflection is significantly decreased for the samples with vias having alternating tapering directions according to an exemplary embodiment of the invention. The deflection is directly linked to the stiffness (N/mm=load/deflection). Thus, the stiffness and accordingly the mechanical stability of the whole build-up is significantly improved when arranging the vias in an alternating way, i.e., with alternating tapering directions 170, 172. The tests are done under room temperature. The load is constantly increased with a speed of 1 mm/min until the force of 10 N is achieved.

Alternating the laser vias on those designs helps to increase and balance the two plated copper layers which results in a lower deflection and a stiffer buildup. This may also prevent a high rate of component carriers with open solder joint.

FIG. 11 illustrates a cross-sectional view of a component carrier 100 according to another exemplary embodiment of the invention.

The component carrier 100 according to FIG. 11 has three stacked electrically insulating layer structures 106. Each of these electrically insulating layer structures 106 may be a core 110, another structure comprising resin and optionally reinforcing particles, or a ceramic. According to FIG. 11, each core 110 may firstly be processed separately before interconnecting the corresponding cores 110 with each other.

The central electrically insulating layer structure 106 has tapering through holes 108 filled completely with an electrically conductive filling 105, wherein a connected electrically conductive layer structure 104 and the electrically conductive filling 105 are made of the same material, preferably copper. As shown, different ones of the through holes 108 of said central electrically insulating layer structure 106 are tapering in opposite directions.

Furthermore, component carrier 100 according to FIG. 11 comprises two further electrically insulating layer structure 106, one on top and one on bottom of the previously described central electrically insulating layer structure 106. Each of said two further electrically insulating layer structures 106 has tapering through holes 108 filled completely with further electrically conductive filling 105, preferably also copper. Also in these two additional electrically insulating layer structures 106, different ones of the further through holes 108 are tapering in opposite directions. Again, the further electrically conductive filling 105 is made of the same material—preferably copper—as the respectively connected electrically conductive layer structure 104.

Since each of the stacked electrically insulating layer structures 106 according to FIG. 11 has (preferably alternatingly) tapering metal-filled through holes 108 with inverse tapering directions, the described embodiment provides excellent results in terms of continuous stiffness, and low tendency of warpage and delamination.

For example, the component carrier 100 according to FIG. 11 can be manufactured by laser drilling each of the cores 110 individually from both opposing main surfaces thereof, to thereby form antiparallel tapering through holes 108 in each core 110. Subsequently, the so processed cores 110 may be stacked and connected with each other, for instance by lamination using an additional uncured resin layer between adjacent cores 110, or by gluing to obtain the component carrier 100 according to FIG. 11.

FIG. 12 illustrates a cross-sectional view of a component carrier 100 according to still another exemplary embodiment of the invention.

Also, the component carrier 100 according to FIG. 12 has three stacked electrically insulating layer structures 106. The central electrically insulating layer structure 106 may be embodied as in FIG. 11.

Furthermore, component carrier 100 according to FIG. 12 comprises two further electrically insulating layer structure 106, one on top and one on bottom of the previously described central electrically insulating layer structure 106. Each of said two further electrically insulating layer structures 106 has a set of further through holes 108 filled with further electrically conductive filling 105. According to FIG. 12, the further through holes 108 of each respective set taper all in the same direction, wherein the further through holes 108 of different sets taper in opposite directions. More specifically, the metal-filled through holes 108 of the top electrically insulating layer structure 106 all taper downwardly, whereas the metal-filled through holes 108 of the bottom electrically insulating layer structure 106 all taper upwardly.

The embodiment of FIG. 12 may be manufactured by firstly manufacturing the central electrically insulating layer structure 106 as described above. Thereafter, further electrically conductive layer structures 104 and further electrically insulating layer structures 106 may be connected, for instance by lamination, to both opposing main surfaces of said central electrically insulating layer structure 106. The respective set of through holes 108 may be formed in each of said two further electrically insulating layer structures 106 by laser drilling from respectively only one side, followed by plating.

Figure 13:
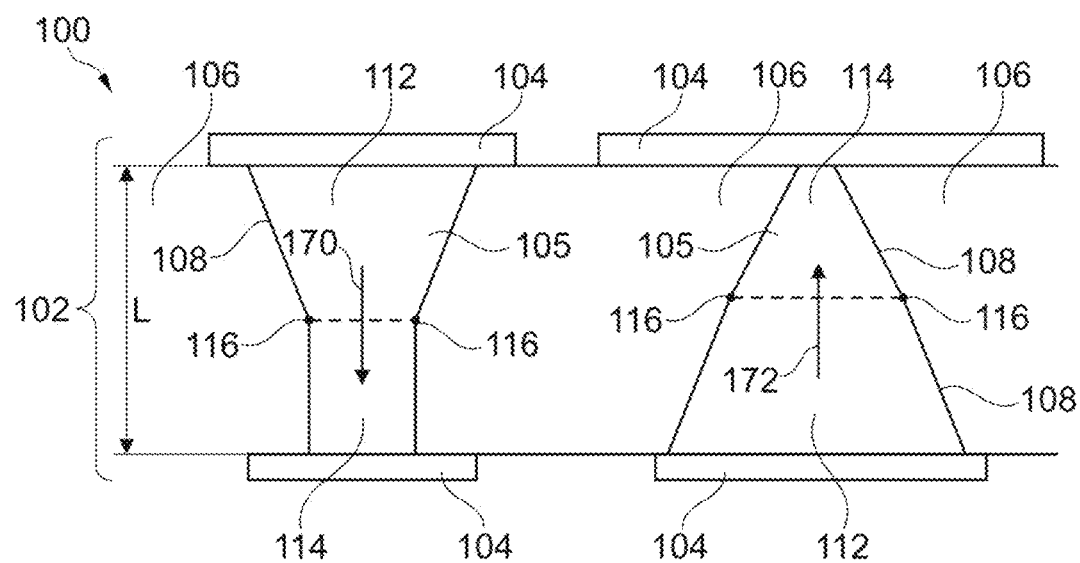
FIG. 13 illustrates a cross-sectional view of a component carrier according to yet another exemplary embodiment of the invention.

FIG. 13 illustrates a cross-sectional view of a component carrier 100 according to yet another exemplary embodiment of the invention.

According to FIG. 13, through holes 108 in electrically insulating layer structure 106 have a first tapering hole section 112 connecting to a second hole section 114 with a kink 116 at an interface between the first tapering hole section 112 and the second hole section 114.

As shown on the left-hand side of FIG. 13, the corresponding second hole section 114 is straight. As shown on the right-hand side of FIG. 13, the second hole section 114 is tapering with another tapering angle than the first tapering hole section 112.

While the tapering through holes 108 of FIG. 1, FIG. 2, FIG. 5, FIG. 11 and FIG. 12 can be manufactured with a single laser shot, the tapering laser through hole geometries according to FIG. 13 may be obtained by executing a double laser shot from the same side of the respective dielectric layer 106. Formation of tapering through holes 108 with a double laser shot may allow to form through holes 108 even in very thick electrically insulating layer structures 106, for instance having a thickness L of more than 100 µm, for instance in a range from 110 µm to 150 µm.

Figure 14:
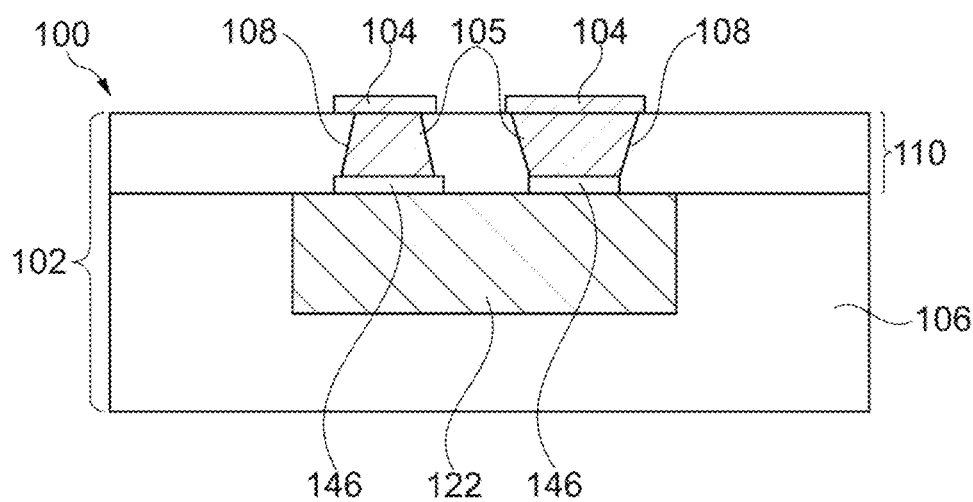
FIG. 14 illustrates a cross-sectional view of a component carrier with an embedded component according to yet another exemplary embodiment of the invention.

FIG. 14 illustrates a cross-sectional view of a component carrier 100 with an embedded component 122 according to yet another exemplary embodiment of the invention.

For example, the embedded component 122 may be a semiconductor chip having electrically conductive pads 146. The pads 146 of the embedded component 122 are electrically coupled by the electrically conductive filling 105 in through holes 108 with inverse tapering directions to a patterned metal-layer type electrically conductive layer structure 104. More specifically, each of the pads 146 may be electrically connected to a respective one of the metal-filled tapering through holes 108, wherein tapering through holes 108 connected to different pads 146 have opposites tapering directions.

The embedded component 122, in particular when made from a semiconductor material such as silicon, can be a weak point of a component carrier 100 in terms of its tendency of warpage and delamination and may be physically prone to thermal load. By balancing out the metal content in an environment of the embedded component 122 by electrically coupling each of the pads 146 with a respective one of the metal-filled tapering through holes 108 arranged with opposite tapering directions, the thermal and mechanical reliability of the component carrier 100 can be significantly improved.

For instance, the portion of the stack 102 above the embedded com-ponent 122 may be manufactured separately by processing a core 110. Thereafter, the processed core 110 may be connected with the lower portion of the stack 102 together with the embedded component 122.

In another embodiment, a bottom side of the embedded component 122 may be connected with metal-filled tapering through holes 108 arranged with opposite tapering directions. In yet another embodiment, a surface mounted (rather than embedded) electronic component 122 may be connected with metal-filled tapering through holes 108 arranged with opposite tapering directions.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
a stack comprising at least one electrically conductive layer structure and at least one electrically insulating layer structure;
wherein at least one of the at least one electrically insulating layer structure has at least partly tapering through holes filled substantially completely with an electrically conductive filling;
wherein the at least one electrically conductive layer structure and the electrically conductive filling are made of the same material;
wherein different ones of the through holes of one electrically insulating layer structure are tapering in opposite directions;
wherein the stack further comprises two further electrically insulating layer structures between which the at least one electrically insulating layer structure is arranged;
wherein each one of the two further electrically insulating layer structures has a set of further through holes filled with further electrically conductive filling;
wherein the further through holes of each respective set taper all in the same direction;
wherein the further through holes of the different sets taper in opposite directions; and
wherein the height of the through holes is delimited by the height of the at least one electrically insulating layer structure.

2. The component carrier according to claim 1, wherein the electrically insulating layer structure with the through holes tapering in opposite directions comprises fully cured resins.

3. The component carrier according to claim 1, wherein the electrically insulating layer structure with the through holes tapering in opposite directions is a central layer structure in the stack.

4. The component carrier according to claim 1, wherein at least part of the through holes have a frustoconical shape.

5. The component carrier according to claim 1, wherein at least part of the through holes have a first tapering hole section connected to a second hole section by a kink.

6. The component carrier according to claim 5, wherein the second hole section is tapering with another tapering angle than the first tapering hole section, or is straight.

7. The component carrier according to claim 1, wherein at least one further of the at least one electrically insulating layer structure has further at least partly tapering through holes filled substantially completely with further electrically conductive filling, wherein different ones of the further through holes are tapering in opposite directions, and wherein the further electrically conductive filling is made of the same material as the at least one electrically conductive layer structure and the electrically conductive filling.

8. The component carrier according to claim 1, wherein the through holes are arranged so that a material distribution of electrically conductive filling on both opposing main surfaces of the electrically insulating layer structure is homogeneous.

9. The component carrier according to claim 1, wherein the through holes are arranged so that a heat removal capability is substantially the same on both opposing main surfaces of the electrically insulating layer structure.

10. The component carrier according to claim 1, wherein the through holes of the electrically insulating layer structure are arranged with alternating tapering directions along a horizontal direction or in a horizontal plane.

11. The component carrier according to claim 1, wherein the through holes of the electrically insulating layer structure filled with the electrically conductive filling have co-planar ends on both opposing main surfaces of the electrically insulating layer structure.

12. The component carrier according to claim 1, wherein a thickness of the electrically insulating layer structure is less than 120 µm.

13. The component carrier according to claim 1, wherein a difference of a ratio between an electrically conductive surface area and an entire surface area at the two opposing main surfaces of the electrically insulating layer structure is less than 25%.

14. The component carrier according to claim 1, wherein the stack comprises at least one further electrically insulating layer structure having further through holes filled with further electrically conductive filling and tapering all in the same direction.

15. The component carrier according to claim 1, wherein the stack comprises at least two further electrically insulating layer structures between which the electrically insulating layer structure is arranged, wherein each of the at least two further electrically insulating layer structures has a set of further through holes filled with further electrically conductive filling, wherein the further through holes of each respective set taper all in the same direction, and wherein the further through holes of different sets taper in opposite directions.

16. The component carrier according to claim 1, wherein at least part of the through holes have a maximum diameter of less than 110 µm.

17. The component carrier according to claim 1, wherein a number of through holes in the electrically insulating layer structure per square millimeter is in a range from 0.5 to 5.

18. The component carrier according to claim 1, comprising at least one of the following features:
wherein a difference between a maximum diameter and a minimum diameter of a respective through hole divided by the maximum diameter is in a range from 10% to 30%;
wherein the at least one electrically conductive layer structure and the electrically conductive filling are made of copper;
a component embedded in or surface-mounted on the stack and being electrically coupled to the electrically conductive filling;
at least 1,000 through holes;
wherein the at least one of the at least one electrically insulating layer structure having through holes tapering in opposite directions and filled substantially completely with the electrically conductive filling is configured as an inlay in the component carrier;
wherein the at least one of the at least one electrically insulating layer structure comprises a ceramic;
wherein adjacent through holes tapering in opposite directions have a center-to-center distance of not more than 125 µm;
wherein a portion of at least one of the at least one electrically insulating layer structure between adjacent through holes tapering in opposite directions has a substantially rhombic shape in a cross-sectional view.

19. A method of manufacturing a component carrier, comprising:
   providing a stack comprising at least one electrically conductive layer structure and at least one electrically insulating layer structure;
   forming at least partly tapering through holes in at least one of the at least one electrically insulating layer structure, wherein different ones of the through holes of one electrically insulating layer structure are tapering in opposite directions;
   substantially completely filling the through holes with an electrically conductive filling made of the same material as the at least one electrically conductive layer structure;
   wherein the stack further comprises two further electrically insulating layer structures between which the at least one electrically insulating layer structure is arranged;
   wherein each one of the two further electrically insulating layer structures has a set of further through holes filled with further electrically conductive filling;
   wherein the further through holes of each respective set taper all in the same direction;
   wherein the further through holes of the different sets taper in opposite directions; and
   wherein the height of the through holes is delimited by the height of the at least one electrically insulating layer structure.

20. The method according to claim 19, comprising at least one of the following features:
   wherein the method comprises forming a first number of the through holes by laser drilling from a first side of the electrically insulating layer structure, and forming a remaining second number of the through holes by laser drilling from an opposing second side of the electrically insulating layer structure;
   wherein the method comprises forming each of the through holes by a single laser shot or by two laser shots from one side of the electrically insulating layer structure;
   wherein the method comprises: defining a number of laser through holes to be formed in the electrically insulating layer structure, and
   calculating an arrangement and a tapering direction of the individual through holes in the electrically insulating layer structure so that a distribution of the electrically conductive filling filling the through holes is homogenized on both opposing main surfaces of the electrically insulating layer structure;
   wherein the method comprises: pre-forming the at least one of the at least one electrically insulating layer structure having through holes tapering in opposite directions and filled substantially completely with the electrically conductive filling as an inlay, and thereafter integrating the inlay in the component carrier.

* * * * *